United States Patent [19]
Stikvoort

[11] Patent Number: 5,994,966
[45] Date of Patent: Nov. 30, 1999

[54] TRANSISTORIZED TWO-PORT VARIABLE-CONDUCTANCE NETWORK

[75] Inventor: Eduard F. Stikvoort, Eindhoven, Netherlands

[73] Assignee: U.S. Philips Corporation, New York, N.Y.

[21] Appl. No.: 09/017,917

[22] Filed: Feb. 3, 1998

[30] Foreign Application Priority Data

Feb. 7, 1997 [EP] European Pat. Off. ............. 97200345

[51] Int. Cl.[6] ...................................... H03F 3/04
[52] U.S. Cl. .................... 330/306; 330/303; 330/305; 327/434; 327/552
[58] Field of Search ..................... 330/303, 306, 330/305, 284; 333/172; 327/436, 434, 296, 552, 554, 334, 339, 387, 551

[56] References Cited

U.S. PATENT DOCUMENTS

| | | | |
|---|---|---|---|
| 3,641,366 | 2/1972 | Fujimoto | 307/251 |
| 4,114,117 | 9/1978 | Ford | 333/70 CR |
| 4,509,019 | 4/1985 | Banu et al. | 330/107 |
| 4,710,726 | 12/1987 | Czarnul | 330/69 |
| 4,758,941 | 7/1988 | Felton et al. | 363/132 |
| 5,686,863 | 11/1997 | Whiteside | 330/260 |

OTHER PUBLICATIONS

"Modification of Banu–Tsivdis Continuous–Time Integrator Structure" Z. Czarnul, IEEE Transactions on Circuits and Systems, vol. CAS–33, No. 7, Jul. 1986, pp. 714–716.

Primary Examiner—Robert Pascal
Assistant Examiner—Henry Choe
Attorney, Agent, or Firm—Brian J. Wieghaus

[57] ABSTRACT

A tunable balanced RC filter circuit of the type in which the resistors are formed as MOS transistors with variable gate voltages for tuning the filter. The MOS transistor takes the form of a series arrangement of individual MOS transistors (T1-1, T1-2, . . . , T1-N; T2-1, T2-2, . . . , T2-N) each having the same d.c. bias on its gate. The gate of each of the individual MOS transistors in the series arrangement also receives a fraction of the a.c. component of the input signal on the input terminals (IT1, IT2) of the two-port network by means of a resistor ladder (R1-1, R1-2, . . . , R1-N, R2-1, R2-2, . . . , R2-N), which is connected to the input terminals (IT1, IT2) via buffers (B1, B2). The a.c. component of the input signal is thus divided among the individual transistors in the series arrangement. In this way it is possible to use MOS transistors with a small gate voltage swing at comparatively large input voltages.

10 Claims, 5 Drawing Sheets

TRANSISTORIZED TWO-PORT VARIABLE-CONDUCTANCE NETWORK

BACKGROUND OF THE INVENTION

The invention relates to a electronic circuit comprising: a two-port network with variable conductance between a pair of input terminals for receiving an input voltage and a pair of output terminals of the two-port network, the two-port network comprising:

- a first transistor having a conduction channel connected between a first input terminal of the pair of input terminals and a first output terminal of the pair of output terminals, and having a control electrode arranged to receive a control voltage to control the conduction of the conduction channel of the first transistor,
- a second transistor having a conduction channel connected between a second input terminal of the pair of input terminals and a second output terminal of the pair of output terminals, and having a control electrode arranged to receive a control voltage to control the conduction of the conduction channel of the second transistor, and
- means for supplying the control voltage to the control electrode of the first transistor and the control electrode of the second transistor.

Such an electronic circuit is known from U.S. Pat. No. 4,509,019, which shows active RC filter circuits comprising balanced amplifiers to which pairwise arranged filter resistors and filter capacitors are connected. To enable the filter circuit to be tuned the filter resistors are formed by MOS transistors whose channel resistance is adjusted by means of a variable voltage on the control electrodes of the MOS transistors. The MOS transistors are arranged in pairs in two-port networks, one MOS transistor being connected between one of the input terminals and one of the output terminals of the two-port network and the other MOS transistor between the other input terminal and the other output terminal. The two-port networks are combined with one or more differential amplifiers having differential inputs and outputs. Depending on their use the two-port networks function as a variable resistance between a balanced signal source and the differential inputs of a differential amplifier, or as a variable feedback resistance between the differential inputs and outputs of a differential amplifier. Thus, active tunable higher-order RC filter circuits can be realized by means of a plurality of differential amplifiers, two-port networks and capacitors arranged in pairs. The pairwise arrangement of the MOS transistors and the balanced signal input largely eliminates the distortion owing to mismatch between the MOS transistors and owing to the non-linear relationship between the channel current and the gate voltage of a MOS transistor.

The MOS transistors are operated in the non-saturation region of their voltage-current transfer characteristics, the resistance of the conduction channel of the transistor being controlled by means of a voltage on the control electrode or gate of the transistor. The progress in technology has resulted in MOS transistors with increasingly thinner gate oxide being available to the designer. A direct consequence of this is that the gate voltage swing between the threshold voltage of the MOS transistor and the voltage at which the channel conduction no longer increases significantly is much smaller than it used to be. Now a problem arises if such a MOS transistor is used as a controllable conductance in the afore-mentioned balanced active RC filter circuits. The voltage range over which the MOS transistor can be used as a controllable conductance in such RC filter circuits is linked to the gate voltage swing. As a result of the reduced gate voltage swing the distortion will increase comparatively rapidly when the signal level remains the same and, consequently, the usability of active RC filter circuits of the afore-mentioned type will decrease.

SUMMARY OF THE INVENTION

It is an object of the invention to improve the usability of filter circuits of this type and to this end the invention is characterized in that the first transistor and the second transistor respectively comprise a series arrangement of at least two individual transistors whose conduction channels are arranged in series between the first input terminal and the first output terminal and between the second input terminal and the second output terminal, respectively, and having their respective control electrodes arranged to receive the control voltage, and the means for supplying the control voltage further include means for adding a signal voltage, which is proportional to the input voltage, to the control voltage for the respective control electrodes of the individual transistors.

Each of the MOS transistors in the two-port network is replaced by a series arrangement of a number of MOS transistors. The control electrodes of the MOS transistors of the series arrangement receive the same or substantially the same controllable direct voltage for the purpose of tuning the filter circuit. A part of the a.c. component of the input signal is superposed on this direct voltage, so that the alternating voltages between the source, drain and gate in each of the series-connected MOS transistors are limited to only a part of the full alternating input voltage. Thus, each MOS transistor "sees" a smaller alternating voltage, as a result of which the distortion is reduced.

It is now necessary to provide control voltages on which a part of the input voltage has been superposed. To this end, the electronic circuit in accordance with the invention is characterized in that the means for supplying the control voltage comprise:

- a first signal follower having an input connected to the first input terminal and having an output,
- a second signal follower having an input connected to the second input terminal and having an output,
- a resistor ladder connected between the output of the first signal follower and the output of the second signal follower, which resistor ladder has respective nodes between successive resistors connected to the respective control electrodes of the series-connected individual transistors, and
- a first controllable current source connected to a first node of the resistor ladder and second controllable current source connected to a second node of the resistor ladder.

The first and the second signal follower buffer the balanced input signal and prevent this signal from being loaded unnecessarily. The nodes of the resistor ladder carry alternating voltages which are proportional to the input voltage. The control electrodes connected to the nodes of the successive resistors thus receive a part of the alternating input voltage. The first controllable current source and the second controllable current source produce the required variable direct voltage on the two ends of the resistor ladder and are preferably characterized in that the first controllable current source and the second controllable current source are substantially identical and are connected to the first nodes of the resistor ladder reckoned from the first input terminal and the second input terminal.

For a uniform division of the alternating input voltage among the control electrodes of the series-connected transistors the electronic circuit is preferably characterized in that the successive resistors of the resistor ladder have substantially equal resistance values.

The signal followers serve for buffering the signal voltages on the input terminals of the two-port network. For this purpose, the electronic circuit in accordance with the invention is characterized in that the first signal follower and the second signal follower are transistors having a control electrode connected to the first input terminal and the second input terminal, respectively, and having main current-carrying electrodes, of which one main current-carrying electrode is connected to the resistor ladder. For the transistors it is possible to use either MOS transistors or bipolar transistors, which can arranged as source followers or emitter followers. The resulting d.c. level shift automatically provides the required d.c. voltage swing between the gates and the conduction channels of the series-connected MOS transistors.

For an even further reduction of the distortion a first additional MOS transistor can be connected between the first input terminal and the second output terminal of the two-port network and a second additional MOS transistor between the second input terminal and the first output terminal. The additional MOS transistors are connected crosswise and the resistance between the input and output terminals is now dependent on the difference between the control voltage between the gates of the additional MOS transistors and the original MOS transistors. This technique is known from U.S. Pat. No. 4,710,726 and from an article "Modification of Banu-Tsividis Continuous-Time Integrator Structure", Z. Czarnul, IEEE Transactions on Circuits and Systems, Vol. CAS-33, No. 7, July 1986, pp. 714–716.

The additional MOS transistors can alternatively be formed by an arrangement of series-connected MOS transistors. To this end, an embodiment of the electronic circuit is further characterized in that the two-port network further comprises:

two further series arrangements of at least two individual transistors whose conduction channels are arranged in series, one of the two further series arrangements being connected between the first input terminal and the second output terminal and the other one of the two further series arrangements being connected between the second input terminal and the first output terminal, and the means for supplying the control voltage further include:

means for adding a signal voltage, which is proportional to the input voltage, to the control voltage for the respective control electrodes of the individual transistors of the two further series arrangements.

The construction of the further series arrangements is similar to the first-mentioned series arrangements. The same applies to the implementation of the further resistor ladders, and the associated controllable current sources and signal followers.

The electronic circuit in accordance with the invention, particularly the two-port network, is very suitable for use in active balanced continuous-time filter structures. For the application, operation and theory of these filter structures reference is made to the afore-mentioned United States Patents and article and the references cited therein.

DESCRIPTION OF THE DRAWINGS

These and other aspects of the invention will be described and elucidated with reference to the accompanying drawings, in which.

In these Figures like parts bear the same reference symbols.

DESCRIPTION OF THE PREFERRED EMBODIMENTS OF THE INVENTION

Figure 1:
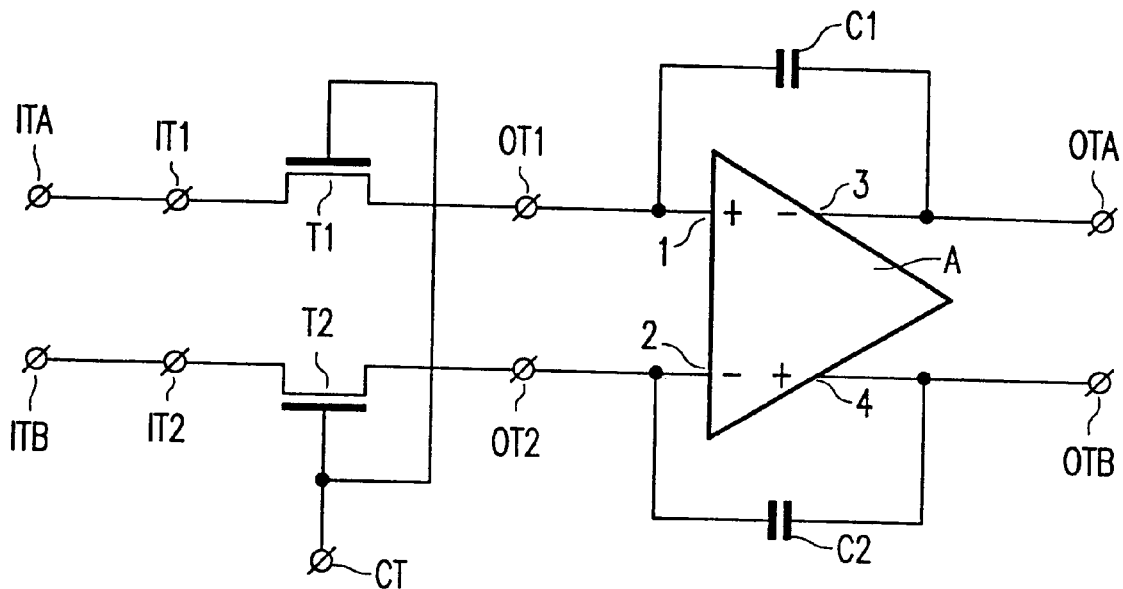
FIG. 1 shows a prior-art electronic filter circuit comprising a two-port network and balanced amplifier.

FIG. 1 shows an electronic filter circuit comprising a two-port network and balanced amplifier as known from the afore-mentioned U.S. Pat. No. 4,509,019. The two-port network comprises a first input terminal IT1, a second input terminal IT2, a first output terminal OT1, a second output terminal OT2, a first MOS transistor T1 having its conduction channel connected between the first input terminal IT1 and the first output terminal OT1 and having its control electrode or gate connected to a control voltage terminal CT, and a second MOS transistor T2 having its conduction channel connected between the second input terminal IT2 and the second output terminal OT2 and having its control electrode or gate also connected to the control voltage terminal CT. The first output terminal OT1 of the two-port network is connected to the non-inverting input 1 of a balanced amplifier A and the second output terminal OT2 is connected to the inverting input 2 of the amplifier A. The amplifier A has an inverting output 3, coupled to a first filter output terminal OTA, and a non-inverting output 4, coupled to a second filter output terminal OTB. A first capacitor C1 is connected between the inverting output 3 and the non-inverting input 1, and a second capacitor C2 is connected between the non-inverting output 4 and the inverting output 2. The first input terminal IT1 is coupled to the first filter input terminal ITA and the second input terminal IT2 is coupled to a second filter input terminal ITB.

The configuration shown in FIG. 1 operates as an integrator having a transfer function which is variable by means of a control voltage on the control voltage terminal CT. The MOS transistors T1 and T2 function as variable resistances and operate in the non-saturation region of the voltage-current transfer characteristic, the resistance of the conduction channels of the MOS transistors varying as a function of the applied gate voltage. A balanced input signal, i.e. two signals of equal magnitude but of opposite phase, is applied to the filter input terminals ITA and ITB. As a result of the symmetry of the configuration, it is achieved, as described in the afore-mentioned U.S. Pat. No. 4,509,019, that the pronounced second-degree distortion caused by the non-linear voltage-current characteristic of a MOS transistor is suppressed to a considerable extent.

Figure 2:
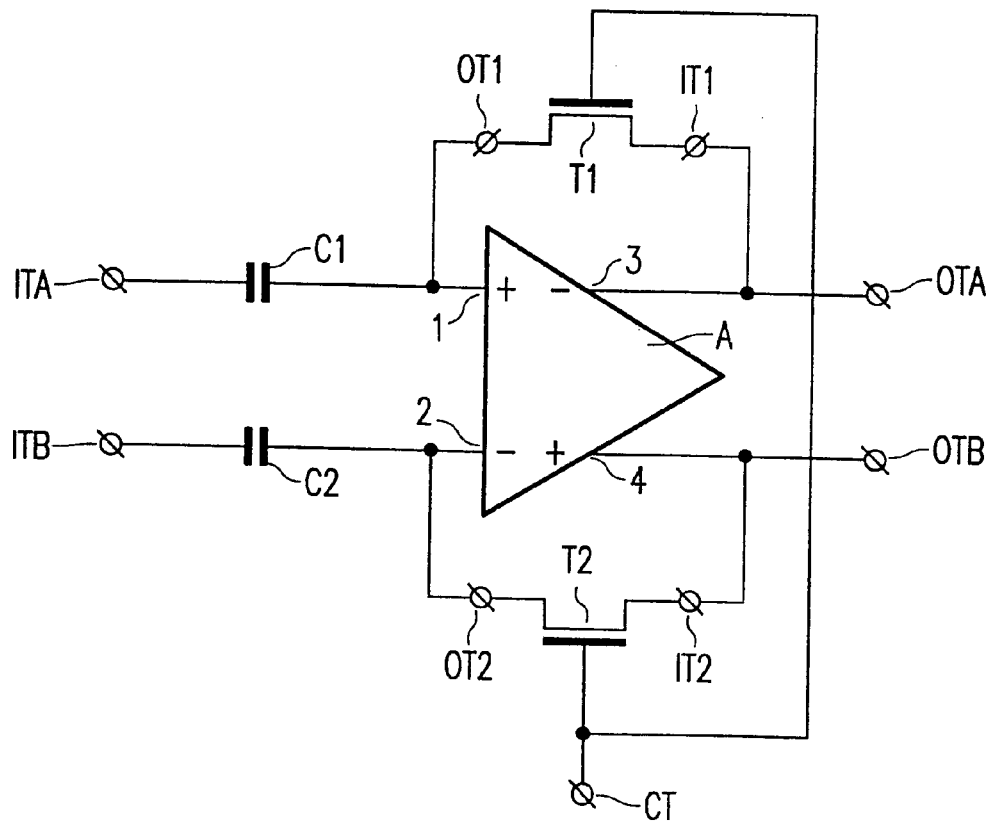
FIG. 2 shows another prior-art electronic filter circuit comprising a two-port network and balanced amplifier.

FIG. 2 shows a variant which is also known from U.S. Pat. No. 4,509,019. The transistors T1 and T2 of the two-port network and the capacitors C1 and C2 have changed places. The filter circuit now operates as a differentiator having a controllable transfer function. The Patent also discloses many other variants in order to realize higher-order filter circuits. However, all the variants utilize one or more two-port networks of the type as shown in FIG. 1.

The progress in technology has resulted in MOS transistors with increasingly thinner gate oxide being available to the designer. A direct consequence of this is that the gate voltage swing between the threshold voltage of the MOS transistor and the voltage at which the channel conduction no longer increases significantly, i.e. at the instant of saturation, is much smaller than it used to be. The "linear" region has become smaller. Now a problem arises if such a MOS transistor is used as a controllable conductance in the afore-mentioned balanced filter circuits. The useful voltage range over in such RC filter circuits is linked to the gate voltage swing. As a result of the reduced gate voltage swing the distortion will increase comparatively rapidly when the signal level remains the same and, consequently, the usability of filter circuits of this type will decrease.

Figure 3:
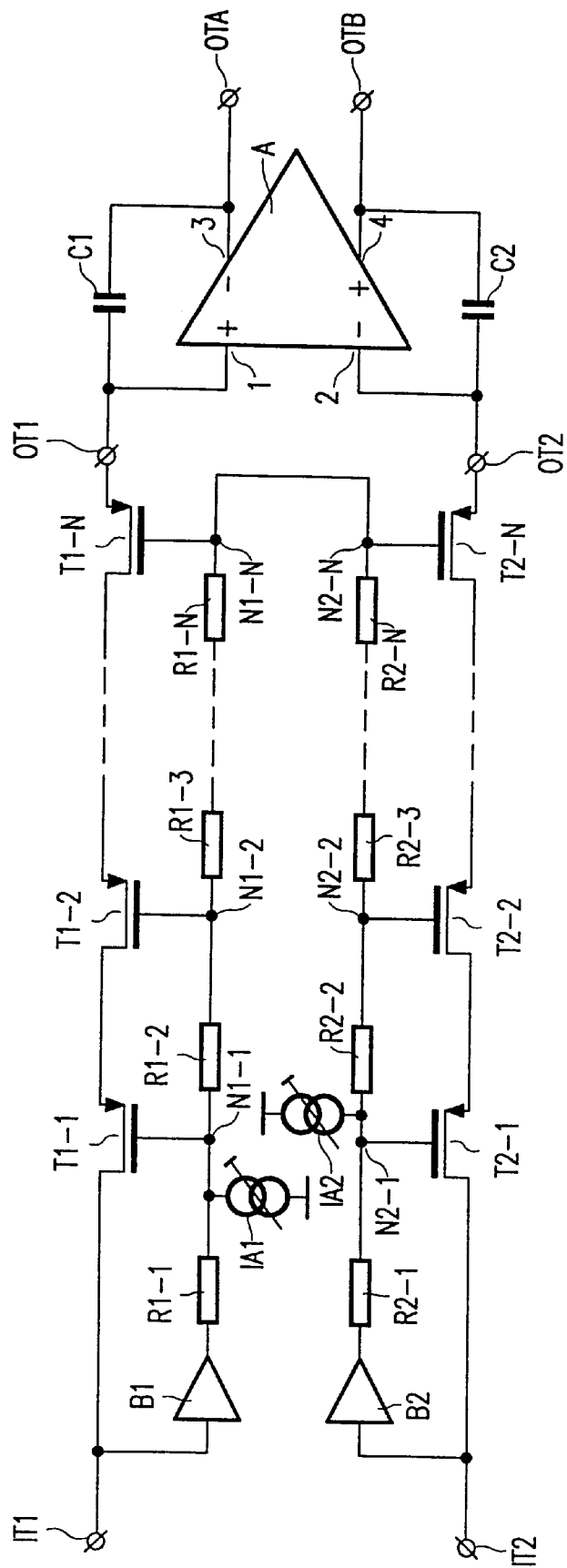
FIG. 3 shows an electronic filter circuit comprising a two-port network and balanced amplifier in accordance with the invention.

FIG. 3 shows a filter circuit in accordance with the invention, the two-port network incorporating measures to lessen the effect of the reduced gate voltage swing. The shown filter circuit is essentially the same as that shown in FIG. 1. However, the first MOS transistor T1 is composed of a plurality of N series-connected transistors T1-1, T1-2, . . ., T1-N, where N is an integer greater than 1. The same has been done for the MOS transistor T2. This transistor is composed of an equal number of N series-connected transistors T2-1, T2-2, . . . , T2-N. The gates of the series-connected transistors T1-1, T1-2, . . . , T1-N are connected to respective nodes N1-1, N1-2, . . . , N1-N of series-connected resistors R1-1, R1-2, . . . , R1-N in a manner as shown in FIG. 3. The gate of the transistor T1-1, is connected to the node N1-1 between the resistors R1-1 and R1-2, the gate of the transistor T1-2 to the next node N1-2 between the resistors R1-2 and R1-3 etc. Likewise, the gates of the series-connected transistors T2-1, T2-2, . . . , T2-N are connected to the nodes N2-1, N2-2, . . . , N2-N of the series-connected resistors R2-1, R2-2, . . . , R2-N. The last resistors R1-N and R2-N are directly connected to one another, as a result of which the nodes N1-N and N2-N coincide. However, if desired, an additional resistor may be included between the nodes N1-N and N2-N. The resistors R1-i (i=1 . . . N) together form a resistor ladder whose extreme resistors R1-1 and R2-1 are connected to the outputs of two signal followers or buffers B1 and B2. The buffer B1 has an input connected to the first input terminal IT1 and the buffer B2 has an input connected to the second input terminal IT2. Furthermore, a current source IA1 connected to the node N1-1 causes a controllable bias current to flow through the resistor R1-1. A similar source IA2 is connected to the node N2-1.

When it is assumed that there is no direct voltage difference on the input terminals IT1 and IT2 and that the resistors R1-1 and R2-1 and the current sources IA1 and IA2 are identical, the direct voltages on the nodes N1-1 and N2-1 are equal to one another. This implies that the gates of all the MOS transistors receive the same direct voltage. This direct voltage is comparable to the control voltage on the control voltage terminal CT in the circuit shown in FIG. 1 and is adjustable by means of the current sources IA1 and IA2. Superposed on the direct voltages on the nodes of the resistor ladder are signal voltages which decrease in amplitude as the sequence number i (i=1 . . . N) of the nodes increases. The superposed signal voltages are proportional to the instantaneous input voltage between the input terminals IT1 and IT2. Thus, it is achieved that the alternating voltages between the gate, source and drain of each of the MOS transistors are limited to a part of the alternating input voltage. The MOS transistors are then not driven into saturation in spite of their reduced gate voltage swing. For a uniform division of the alternating voltage among the MOS transistors all the resistors R1-1, R1-2, . . . , R1-N, R2-1, R2-2, . . . , R2-N of the resistor ladder have the same value.

Figure 4:
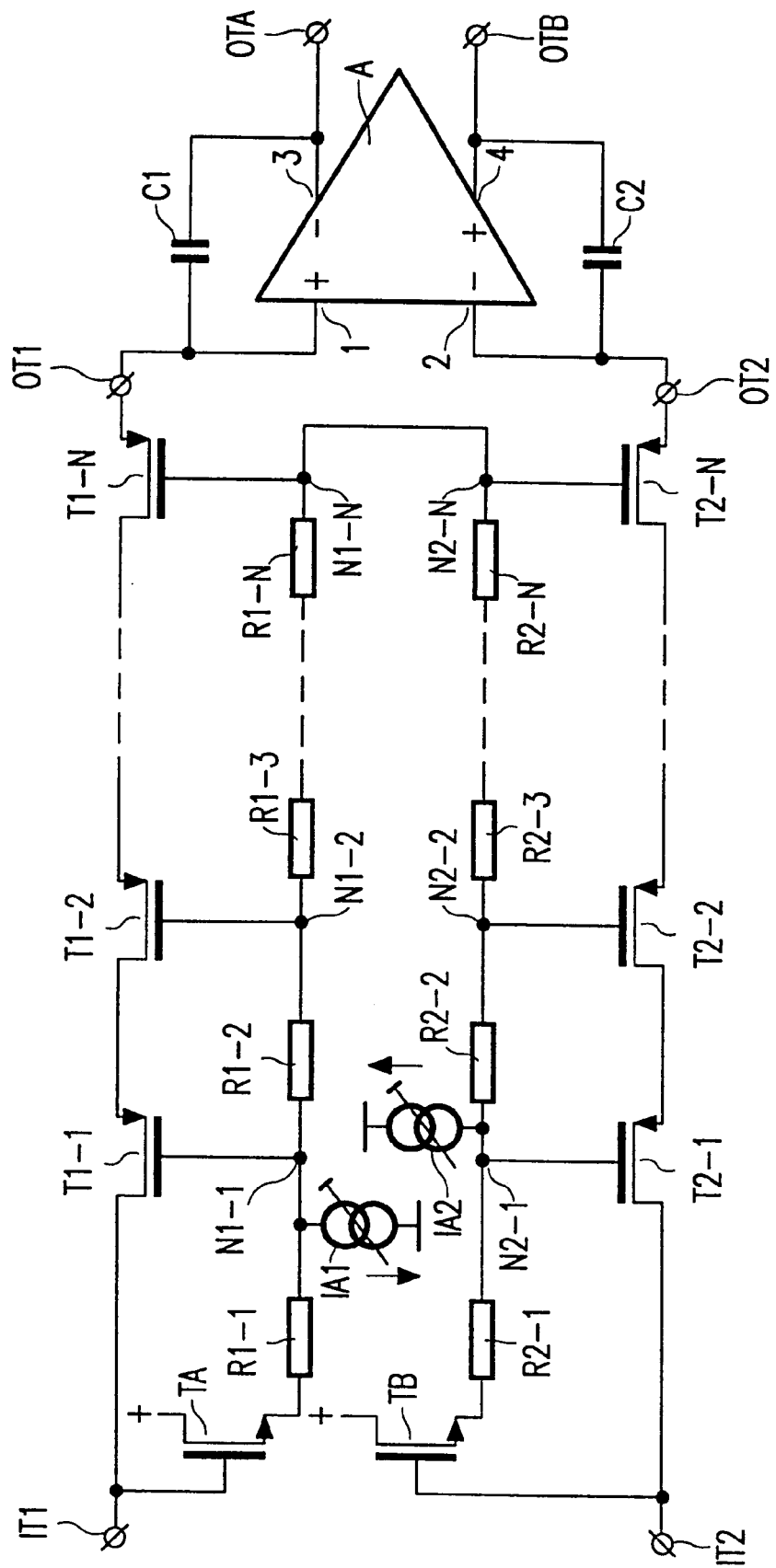
FIG. 4 shows an embodiment of an electronic filter circuit comprising a two-port network and balanced amplifier in accordance with the invention.

FIG. 4 shows an embodiment in which the buffers B1 and B2 comprise MOS transistors TA and TB arranged as source followers. However, the transistors TA and TB can alternatively be bipolar transistors arranged as emitter followers.

Figure 5:
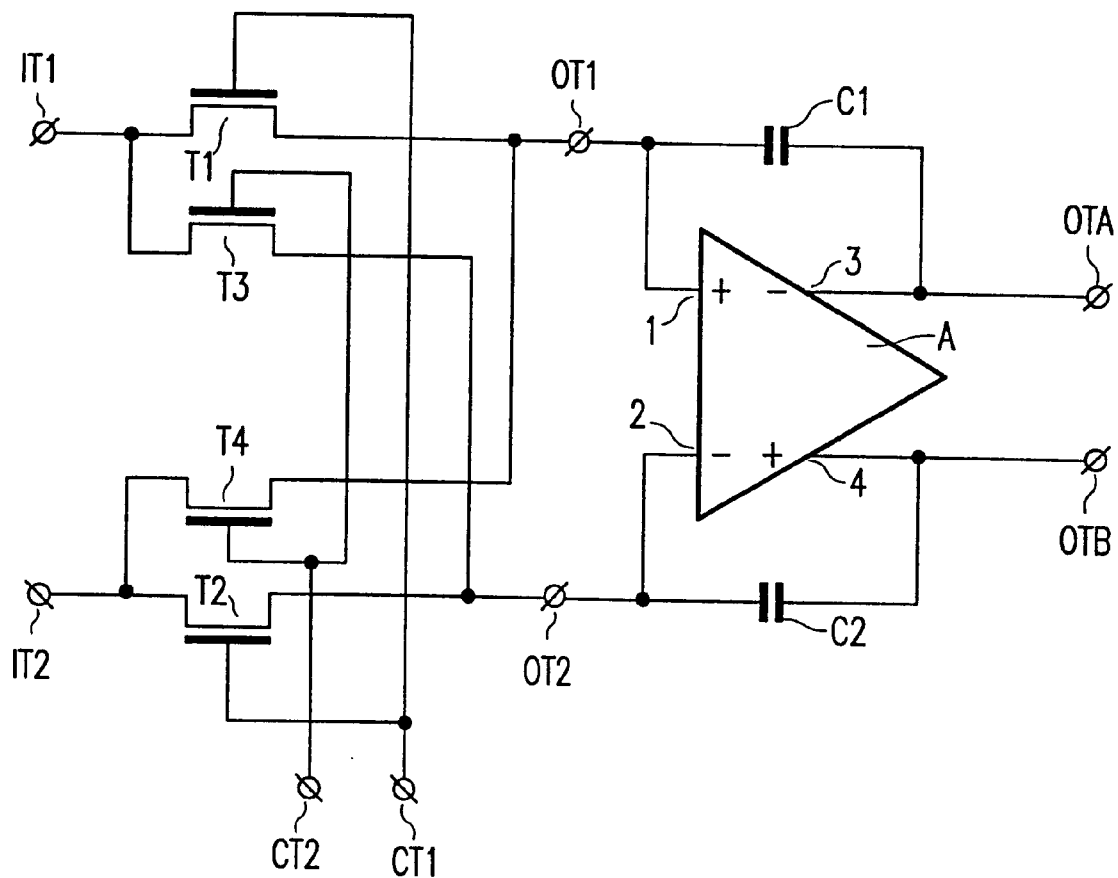
FIG. 5 shows a prior-art electronic filter circuit comprising an extended two-port network and balanced amplifier.

FIG. 5 shows a modification of the two-port network which is known per se from U.S. Pat. No. 4,710,726 and from an article "Modification of Banu-Tsividis Continuous-Time Integrator Structure", Z. Czarnul, IEEE Transactions on Circuits and Systems, Vol. CAS-33, No. 7, July 1986, pp. 714–716. The conduction channel of a third MOS transistor T3 is connected between the first input terminal IT1 and the second output terminal OT2 and the conduction channel of a fourth MOS transistor is connected between the second input terminal IT2 and the first output terminal OT1. The transistors T1 and T2 have their gates connected to a first control voltage terminal CT1 and the transistors T3 and T4 have their gates connected to a second control voltage terminal CT2. The mutual impedance of the two-port network thus modified is the proportional to the voltage difference between the control voltage terminals CT1 and CT2. As set forth in U.S. Pat. No. 4,710,726 and the aforementioned article, this modification provides an even further reduction of the distortion.

Figure 6:
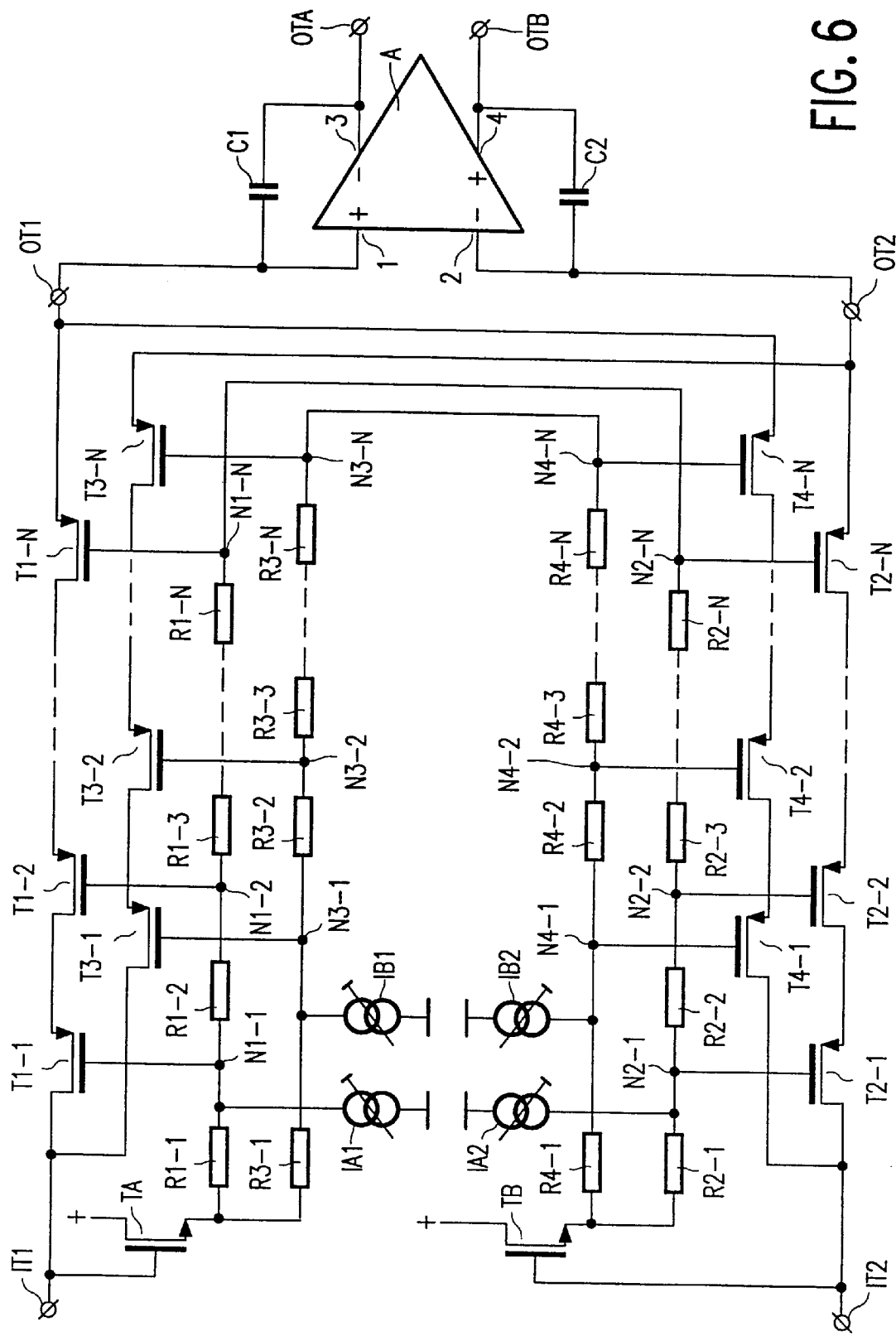
FIG. 6 shows an embodiment of an electronic filter circuit comprising an extended two-port network and balanced amplifier in accordance with the invention.

FIG. 6 shows the circuit of FIG. 5, in which all the four MOS transistors T1–T4 are formed by series-connected transistors with associated resistor ladders. As far as the MOS transistors T1 and T2 are concerned the circuit is identical to that of FIG. 4. The MOS transistors T3 and T4 are likewise formed by series-connected transistors T3-1 . . . T3-1 and T4-1 . . . T4-N, respectively, whose gates are connected to the nodes N3-1 . . . N3-N and N4-1 . . . N4-N, respectively, of the respective resistor chains R3-1 . . . R3-N and R4-1 . . . R4-N. The nodes N3-1 and N4-1 are connected to controllable current sources IB1 and IB2, respectively, whose function is comparable to that of the control voltage on the control voltage terminals CT1 and CT2 in FIG. 5. The resistance of the two-port network is proportional to the difference of the currents supplied by the current sources IA1 and IA2 and the current sources IB1 and IB2. For reasons of symmetry the four basic transistors T1, T2, T3 and T4 are each composed of the same number of transistors. The source follower transistors TA and TB provide the signal supply to the two resistor ladders. However, alternatively each of the two resistor ladders can be energized by means of separate buffers, source followers or emitter followers.

All the examples are based on a filter circuit of the type as shown in FIG. 1 and FIG. 5. It will be evident that the invention is not limited thereto and that other configurations comprising a two-port network and balanced amplifier are also possible, for example the configuration shown in FIG. 2.

The conductivity type of the MOS transistors in the examples of FIGS. 3, 4 and 6 has also been selected merely by way of example. At option, PMOS or NMOS transistors of the enhancement type or of the depletion type can be selected for the series-connected transistors, as appropriate for a design.

With the aid of the examples a tunable balanced RC filter circuit has been described of the type in which the resistors are included in a two-port network and are implemented by means of a MOS transistor with variable gate voltage for tuning the filter. The MOS transistor takes the form of a series arrangement of individual MOS transistors T1-1, T1-2,... T1-N; T2-1, T2-2,..., T2-N each having the same d.c. bias on its gate. The gate of each of the individual MOS transistors in the series arrangement also receives a fraction of the a.c. component of the input signal on the input terminals IT1, IT2 of the two-port network by means of a resistor ladder R1-1, R1-2, . . . , R1-N, R2-1, R2-2, . . . , R2-N, which is connected to the input terminals IT1, IT2 via the buffers B1, B2. The a.c. component of the input signal is thus divided among the individual transistors in the series arrangement. In this way it is possible to use MOS transistors with a small gate voltage swing at comparatively large input voltages. The technique can also be used in a modified two-port network in which two additional MOS transistors T3, T4 are cross-coupled between the input terminals IT1, IT2 and the output terminals OT1, OT2 of the two-port network.

I claim:

1. An electronic circuit comprising: a two-port network with variable conductance between a pair of input terminals for receiving an input voltage and a pair of output terminals of the two-port network, the two-port network comprising:

a first transistor having a conduction channel connected between a first input terminal of the pair of input terminals and a first output terminal of the pair of output terminals, and having a control electrode arranged to receive a control voltage to control the conduction of the conduction channel of the first transistor, a second transistor having a conduction channel connected between a second input terminal of the pair of input terminals and a second output terminal of the pair of output terminals, and having a control electrode arranged to receive a control voltage to control the conduction of the conduction channel of the second transistor, and means for supplying the control voltage to the control electrode of the first transistorand the control electrode of the second transistor, characterized in that the first transistor and the second transistor respectively comprise a series arrangement of at least two individual transistors whose conduction channels are arranged in series between the first input terminal and the first output terminal and between the second input terminal and the second output terminal respectively, and having their respective control electrodes arranged to receive the control voltage, and the means for supplying the control voltage further include means for adding a signal voltage, which is proportional to the input voltage, to the control voltage for the respective control electrodes of the individual transistors.

2. An electronic circuit as claimed in claim 1, characterized in that the means for supplying the control voltage comprise:

a first signal follower having an input connected to the first input terminal and having an output, a second signal follower having an input connected to the second input terminal and having an output, a resistor ladder connected between the output of the first signal follower and the output of the second signal follower, which resistor ladder has respective nodes between successive resistors connected to the respective control electrodes of the series-connected individual transistors, and a first controllable current source connected to a first node of the resistor ladder and second controllable current source connected to a second node of the resistor ladder.

3. An electronic circuit as claimed in claim 2, characterized in that the first controllable current source and the second controllable current source are substantially identical and are connected to the first nodes of the resistor ladder reckoned from the first input terminal and the second input terminal.

4. An electronic circuit as claimed in claim 2, characterized in that the successive resistors of the resistor ladder have substantially equal resistance values.

5. An electronic circuit as claimed in claim 2, characterized in that the first signal follower and the second signal follower are transistors, having a control electrode connected to the first input terminal and the second input terminal, respectively, and having main current-carrying electrodes, of which one main current-carrying electrode is connected to the resistor ladder.

6. An electronic circuit as claimed in claim 2, characterized in that the two-port network further comprises:

two further series arrangements of at least two individual transistors each whose conduction channels are arranged in series, one of the two further series arrangements being connected between the first input terminal and the second output terminal and the other one of the two further series arrangements being connected between the second input terminal and the first output terminal, and the means for supplying the control voltage further include:

means for adding a signal voltage, which is proportional to the input voltage, to the control voltage for the respective control electrodes of the individual transistors of the two further series arrangements.

7. An electronic circuit as claimed in claim 6, characterized in that the means for supplying the control voltage further include:

a further resistor ladder connected between the output of the first signal follower and the output of the second signal follower, which further resistor ladder has respective nodes between sucessive resistors of the further resistor ladder connected to the respective control electrodes of the series-connected individual transistors of the two further series arrangements of transistors, and a third controllable current source connected to a first node of the further resistor ladder and fourth controllable current source connected to a second node of the further resistor ladder.

8. An electronic circuit as claimed in claim 7, characterized in that the third controllable current source and the fourth controllable current source are substantially identical and are connected to the first nodes of the further resistor ladder reckoned from the first input terminal and the second input terminal.

9. An electronic circuit as claimed in claim 8, characterized in that the sum of a current supplied by the first and the second controllable current source and a current supplied by the third and the fourth controllable current source is substantially constant.

10. An electronic circuit as claimed in claim 1, characterized in that the electronic circuit further includes an amplifier having an inverting input and a non-inverting input of which one input is connected to the first output terminal of the two-port network and of which the other input is connected to the second output terminal of the two-port network.

* * * * *